United States Patent [19]

Tsujikawa et al.

[11] Patent Number: 5,555,316
[45] Date of Patent: Sep. 10, 1996

[54] INSPECTING APPARATUS OF MOUNTING STATE OF COMPONENT OR PRINTING STATE OF CREAM SOLDER IN MOUNTING LINE OF ELECTRONIC COMPONENT

[75] Inventors: Toshihiko Tsujikawa, Toyonaka; Seiji Mizuoka, Moriguchi; Masao Nagamoto, Neyagawa, all of Japan

[73] Assignee: Matsushita Electric Industrial Co., Ltd., Osaka-fu, Japan

[21] Appl. No.: 83,700

[22] Filed: Jun. 30, 1993

[30] Foreign Application Priority Data

Jun. 30, 1992 [JP] Japan .................... 4-172984
Jul. 8, 1992 [JP] Japan .................... 4-180759
Jul. 10, 1992 [JP] Japan .................... 4-183519
Jul. 10, 1992 [JP] Japan .................... 4-183520

[51] Int. Cl.⁶ .................................................. G06K 9/00
[52] U.S. Cl. ........................ 382/150; 348/90; 348/126
[58] Field of Search .............................. 382/8, 30, 34, 382/209, 218, 145, 146, 147, 150; 348/86, 87, 90, 94, 95, 125, 126

[56] References Cited

U.S. PATENT DOCUMENTS

| | | | |
|---|---|---|---|
| 5,023,916 | 6/1991 | Breu | 382/8 |
| 5,125,036 | 6/1992 | Raghavan et al. | 382/8 |
| 5,134,665 | 7/1992 | Jyoko | 382/8 |
| 5,148,375 | 9/1992 | Horikami | 382/8 |
| 5,164,994 | 11/1992 | Bushroe | 382/8 |
| 5,182,775 | 1/1993 | Matsui et al. | 382/8 |
| 5,268,968 | 12/1993 | Yoshida | 382/8 |

*Primary Examiner*—Joseph Mancuso
*Attorney, Agent, or Firm*—Wenderoth, Lind & Ponack

[57] ABSTRACT

An inspecting apparatus is arranged on an electronic component mounting line for inspecting whether a mounting state of the component mounted by a mounting apparatus in a precedent process or a printing state of a cream solder by a cream solder printing apparatus in a precedent process is non-defective or defective. The inspecting apparatus includes an input device for taking data of the mounting state of the component to be inspected or the printing state of the cream solder to be inspected, a comparing device for comparing the data of the mounting state or the printing state input through the input device with an absolute decision criterion having a predetermined allowable range to decide whether the mounting state or the printing state is non-defective or defective and an operating state criterion which is within and narrower than the allowable range of the absolute decision criterion and a deciding device for deciding an operating state of the mounting apparatus or the cream solder printing apparatus in the precedent process based the data which is both within the absolute decision criterion and outside the operating state criterion.

2 Claims, 16 Drawing Sheets

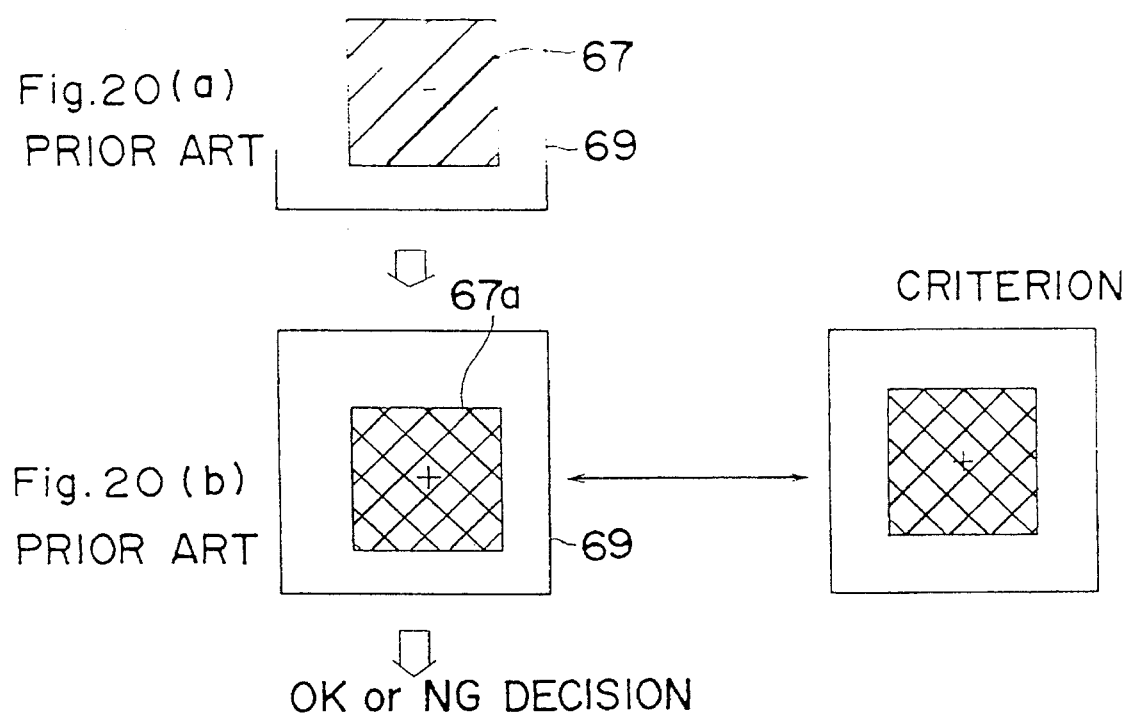
Fig.20(a) PRIOR ART
Fig.20(b) PRIOR ART
CRITERION
OK or NG DECISION
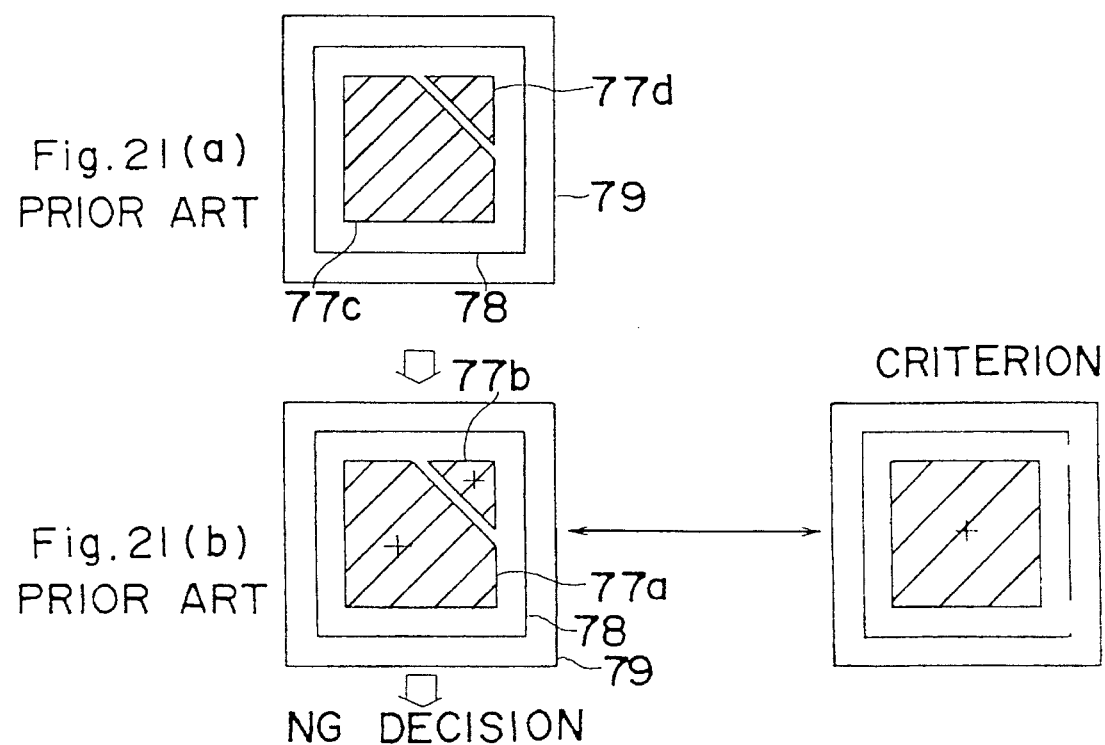
Fig.21(a) PRIOR ART
Fig.21(b) PRIOR ART
CRITERION
NG DECISION

INSPECTING APPARATUS OF MOUNTING STATE OF COMPONENT OR PRINTING STATE OF CREAM SOLDER IN MOUNTING LINE OF ELECTRONIC COMPONENT

BACKGROUND OF THE INVENTION

The present invention relates to an inspecting apparatus for inspecting the mounting state of an electronic component or the printing state of a cream solder on an electronic component mounting line.

With the recent trend toward mounting of small electronic component chips on a printed circuit board, it has become difficult to visually inspect the mounting state of the electronic component or the printing state of a cream solder of the electronic component by relying on the naked eye of an operator. Accordingly, as depicted below, a inspecting apparatus is used for inspecting the printing state of cream solder.

In a conventional system shown in FIG. 19, the mounting state of each printed circuit board 2 supplied from a precedent process (a printing apparatus of a cream solder) 1 is inspected by an inspecting apparatus 3. Non-defective ones and defective ones are respectively sent to a subsequent process 4 and a printed circuit board stockroom 5.

The inspecting apparatus 3 measures the area of the cream solder, etc. (mounting position, etc. in the case where the precedent process is a mounting apparatus of an electronic component), thereby deciding, as shown in FIG. 6, that those in the allowable range are good or non-defective (represented by (g)) and those outside the allowable range are not acceptable (indicated by (b)), on the basis of a preset absolute decision criterion (A).

In the above example, however, since the decision of the inspecting apparatus 3 is based only on the absolute decision criterion (A), it is difficult to know the operating state of the apparatus in the precedent process and to predict a dangerous state.

People skilled in the technical field may be able to devise an inspecting method of enabling the detection and monitoring of the operating state of the apparatus in the preceding process 1 on the basis of all the data measured by the inspecting apparatus 3. However, in such method it takes a long time to process all the data, therefore the method suffers a drawback in that the dangerous condition cannot be rapidly predicted based on data obtained in the precedent process in a mass production system.

SUMMARY OF THE INVENTION

An object of the present invention is to provide an inspecting apparatus and method for inspecting a mounting state of an electronic component or a printing state of a cream solder on an electronic component mounting line which takes a shorter time to process all the data, therefore providing an advantage in that data used to predict a dangerous condition can be obtained in the precedent process with rapid timing in a mass production system.

In accomplishing these and other objects, according to a first aspect of the present invention, there is provided an inspecting apparatus arranged on a mounting line of an electronic component for inspecting whether or not a mounting state of the component mounted by a mounting apparatus in a precedent process or a printing state of a cream solder by a cream solder printing apparatus in a precedent process is non-defective or defective, the inspecting apparatus comprising: an input device for taking data of the mounting state of the component to be inspected or the printing state of the cream solder to be inspected; a comparing means for comparing the data of the mounting state or the printing state input through the input device with an absolute decision criterion having a predetermined allowable range to decide whether or not the mounting state or the printing state is non-defective or defective and an operating state criterion inside the allowable range of the absolute decision criterion and narrower than the allowable range; and a deciding means for deciding an operating state of the mounting apparatus or the cream solder printing apparatus in the precedent process when the data within the absolute decision criterion but outside the operating state criterion is input thereto subsequent to the comparison.

According to the first aspect of the present invention, the inspecting apparatus is equipped with the operating state criterion, in addition to the absolute decision criterion, to detect the operating state of the apparatus in the precedent process. The operating state of the apparatus in the precedent process is detected based on the inspecting data beyond the operating state criterion (outside the allowable range).

Therefore, if the frequency of the inspecting data outside the operating state criterion is not smaller than a predetermined value, the operating state of the apparatus in the precedent process is decided to be not good. Moreover, the operating accuracy of the apparatus in the precedent process can be detected specifically on the basis of the above inspecting data, so that the data predicting the dangerous condition can be obtained for the apparatuses in the whole line.

Since it is so adapted that the data for predicting the dangerous condition is not obtained by processing all the inspecting data, but by processing only the inspecting data outside the operating state criterion, the present invention realizes the processing and decision making of the data in a short time.

According to a second aspect of the present invention, there is provided the inspecting apparatus in which the inspecting apparatus is an inspecting apparatus to decide whether or not the printing state of the cream solder is non-defective or defective by measuring an area of the cream solder on a printed circuit board printed by the cream solder printing apparatus in the precedent process, the absolute decision criterion is formed on the basis of a design value of a metal mask to decide whether or not the printing state of the cream solder is non-defective or defective, while the operating state criterion is formed on the basis of the design value of the metal mask to decide whether or not the operating state of the cream solder printing apparatus is non-defective or defective, and the deciding means is provided with: a deciding means for deciding whether or not there is a data within the absolute decision criterion, but outside the operating state criterion; an average value calculating means for calculating an average value of the data when the data is decided by the deciding means to be outside the operating state criterion; a change deciding means for deciding whether or not the calculated average value is shifted within a predetermined range; and an automatic criterion changing means for changing the operating state criterion in such a manner as not to decide defective as non-defective if the average value is decided by the change deciding means to be shifted within the predetermined range, and then inputting a new operating state criterion to the comparison means to replace the operating state criterion.

The second aspect of the present invention is provided to satisfy the following demand other than the above-described objects if the above operating state criterion is set on the basis of only the design value of the metal mask. In other words, an error between the area of a specified portion such as an opening portion of the metal mask and the design value thereof cannot be avoided as a result of the processing error at the manufacturing time of the metal mask. A large error is often generated particularly at a specific opening portion, for example. In some cases, the cream solder is actually correctly printed even when the area of the cream solder corresponding to the specific opening portion is detected to be outside the operating state criterion, and vice versa in an extreme case. Additionally, if it happens that the area of the cream solder corresponding to the specific opening portion is frequently decided to be outside the criterion, the operator might be obliged to measure the area of the opening portion of the metal mask by means of an optical microscope or the like to make the cause clear, which considerably decreases the operating efficiency.

In the above case where only the area of the cream solder corresponding to the specific opening portion exceeds the criterion so often, it may be predicted to result from the processing error between the area of the opening portion and the design value. Therefore, if the criterion for the specific opening portion is based on the design value of the metal mask, the actual state cannot be detected correctly.

In such a case as above, according to the second aspect of the present invention, the operating state criterion is automatically changed based on the measuring data of the area of the cream solder to meet actual conditions.

According to a third aspect of the present invention, there is provided an inspecting apparatus for inspecting whether or not cream solders on a printed circuit board printed by a cream solder printing apparatus are non-defective or defective, the inspecting apparatus comprising: a printing position detecting means for detecting printing positions of the cream solders printed at least at three points on the printed circuit board, to thereby obtain a shifting amount of printing to correct a position of a metal mask or the printed circuit board; and an output means for outputting the shifting amount of printing to an automatic position setting means for setting the position of the metal mask or the printed circuit board based on the shifting amount.

A printing position detecting means of an inspecting apparatus according to the third aspect of the present invention detects the printing position of the cream solder printed at least at three points on the printed circuit board, to thereby properly obtain the shifting amount of the printing position of the cream solder. The data of the shifting amount is outputted to the printing apparatus, and the position of the metal mask is automatically corrected by an automatic position setting means of the printing apparatus. Accordingly, the cream solder can be always printed with stable positioning accuracy and efficiently without bothering the operator for the correcting operation.

According to a fourth aspect of the present invention, there is provided an inspecting method for inspecting printing states of cream solders printed on a printed circuit board through a color image processing with the use of an image picked up by an image pick-up device, which comprises: a setting process to set a window for a region in a picked-up image where each cream solder is to be printed; a detecting process to perform color extraction of each cream solder within the window and then to detect patterns of the cream solders of areas not smaller than a preset value; a calculating process to calculate positions of the cream solders from a sum of positions of centers of gravity of the detected cream solder patterns corresponding to an area ratio of each detected cream solder pattern; and a deciding process to decide whether or not the printing states of the cream solders are non-defective or defective by comparing the calculated position with a reference position of each cream solder.

The fourth aspect of the present invention is provided to satisfy the following demand other than the above-described objects. Printing of a cream solder has conventionally been inspected in a manner as described below. As shown in FIG. 20(a), a window 69 is set in picked-up color image by an image pick-up device to surround the contour of a cream solder 67. Then, as shown in FIG. 20(b), the color extraction of the cream solder 67 in the window 69 is carried out, and the area and the position of the cream solder 67 are detected as one pattern (binary pattern after the color extraction and the detection). The cream solder 67 is decided through comparison of the detected area with a reference area and the detected position with a reference position. However, as illustrated in FIG. 21(a), a cream solder 77 formed on an electrode component 78 of the printed circuit board may be partly dimmed and separated to 77c and 77d depending on the printing state. In this case, each of the cream solders 77c and 77d in a window 79 is processed through color extraction, and then the areas and the positions of the extracted cream solders 77a, 77b are respectively detected as one pattern. In comparison between each detected area and a reference area and between each detected position and a reference position, it is decided whether or not the cream solder is printed properly. As a result, even a good cream solder is decided to be a failure in the prior art.

Contrarily, in the inspecting method of the fourth aspect of the present invention, it becomes possible to correctly detect the position and the area of a cream solder even if the cream solder is partly dimmed and separated from one another depending on the printing condition.

BRIEF DESCRIPTION OF THE DRAWINGS

These and other objects and features of the present invention will become clear from the following description taken in conjunction with the preferred embodiments thereof with reference to the accompanying drawings, in which:

FIGS. 20(a) and 20(b) are respectively schematic diagrams of a printed pattern of cream solder in a conventional inspecting method when part of the cream solder is dimmed, but not separated; and FIGS. 21(a) and 21(b) are respectively schematic diagrams of a printed pattern of cream solder in a conventional inspecting method when part of the cream solder is dimmed and separated from each other.

DETAILED DESCRIPTION OF THE PREFERRED EMBODIMENTS

Figure 1A:
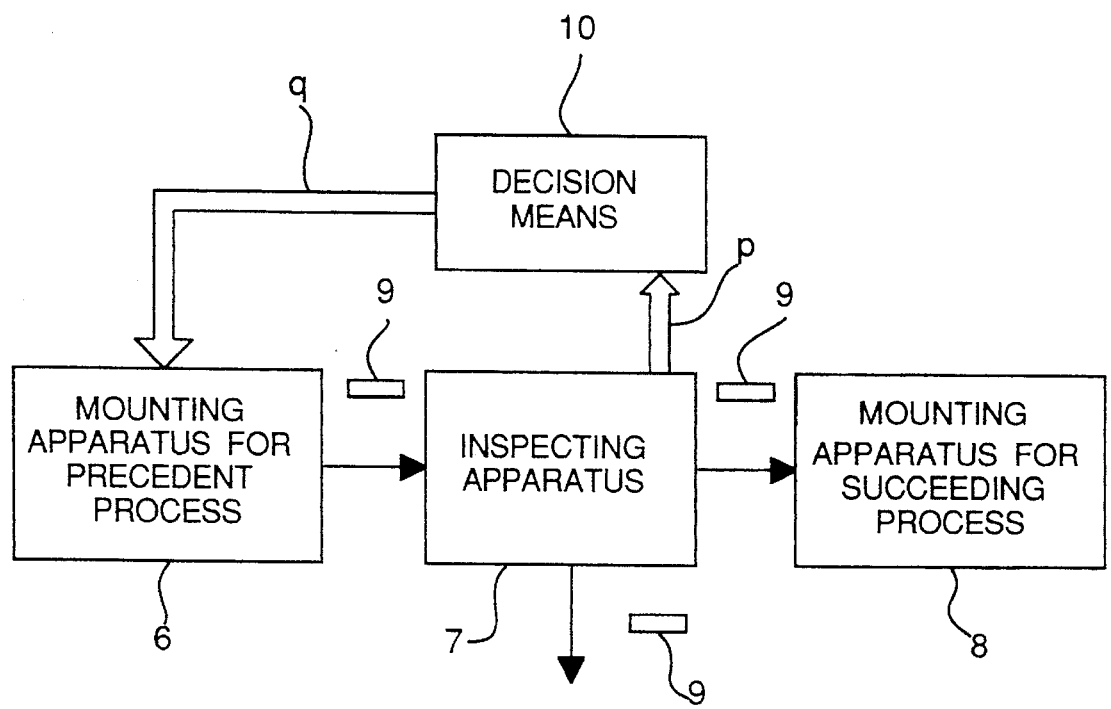
FIG. 1A is a schematic block diagram of a mounting line including an inspecting apparatus according to a first embodiment of the present invention.

Before the description of the present invention proceeds, it is to be noted that like parts are designated by like reference numerals throughout the accompanying drawings.

A first embodiment of the present invention will be described with reference to FIGS. 1A, 1B, and 2.

Figure 1B:
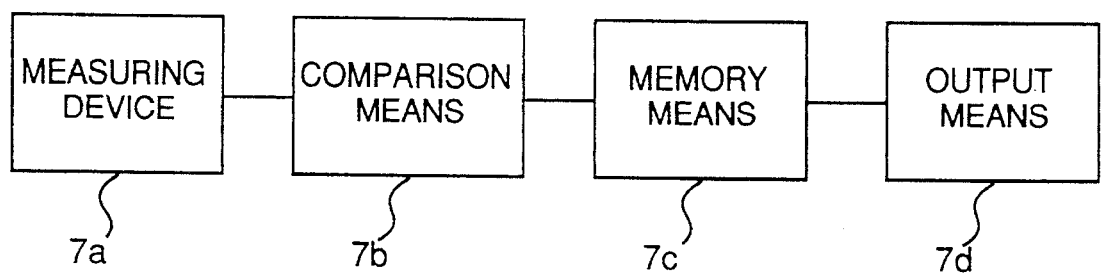
FIG. 1B is a block diagram of the inspecting apparatus of FIG. 1A.

In FIG. 1A, a mounting apparatus 6 for mounting electronic components on works in a precedent process, an inspecting apparatus 7 for inspecting the mounting state of processed works in the precedent process and a mounting apparatus 8 for mounting electronic components on works in a succeeding process are all arranged on the mounting line. A printed circuit board (work) 9 processed by the apparatus 6 in the precedent process is inspected by the inspecting apparatus 7. If electronic components are properly mounted on the work, the work is transferred to the apparatus 8 for the succeeding process. An inferior work (defective) is sent to, for example, a printed circuit board stockroom.

Figure 2:
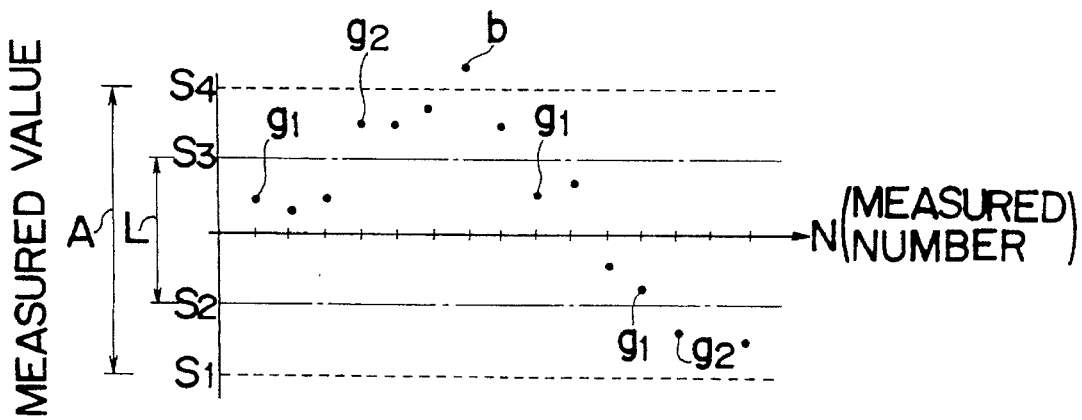
FIG. 2 is a diagram showing the inspecting criterion of the inspecting apparatus of FIG. 1A.

An absolute decision criterion (A) is set for the apparatus 7, as shown in FIG. 2. The apparatus 7 decides whether or not the mounting state of electronic components on the work is good within the predetermined allowable range of the criterion (A). At the same time, an operating state criterion (L) which is narrower in the range than the absolute decision criterion (A) within the absolute decision criterion (A) is also set for the apparatus 7.

Figure 14:
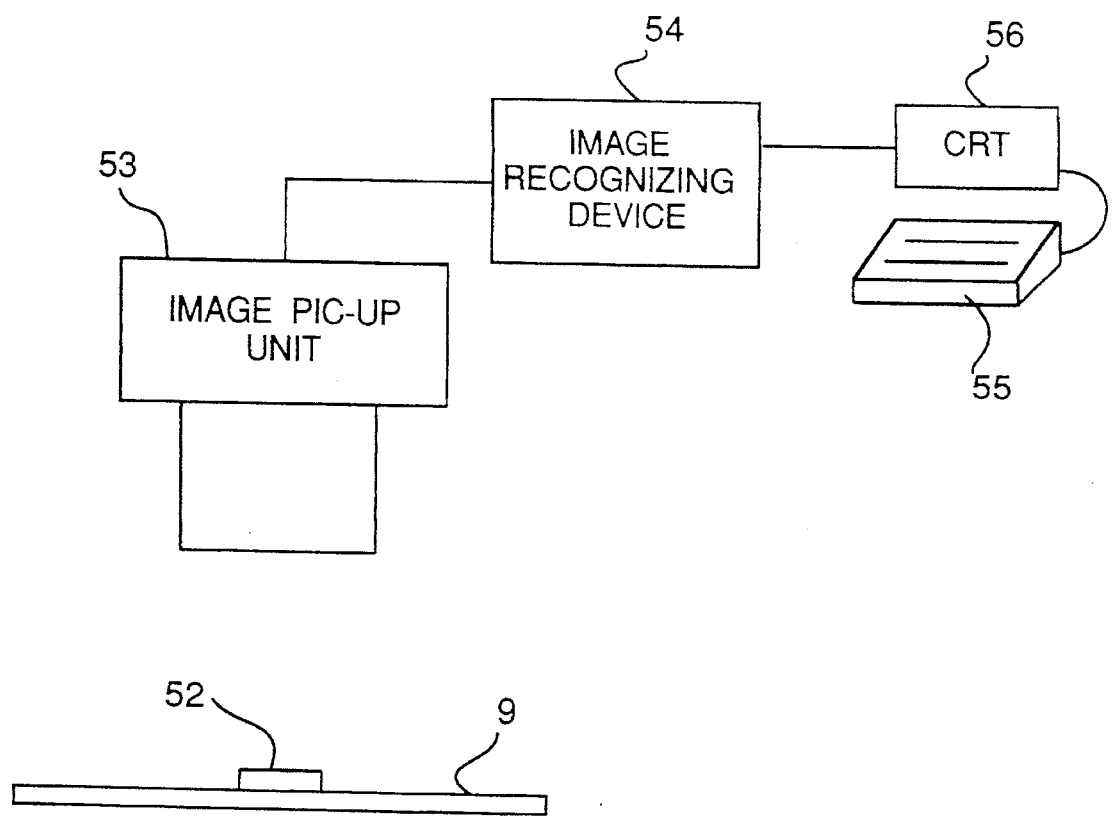
FIG. 14 is a schematic block diagram of an apparatus to be used in an inspecting method of printing of cream solder according to a fourth embodiment of the present invention.

The above inspecting apparatus 7 is provided with a measuring device 7a which measures the mounting area and position of the each of electronic components in an electronic component mounting apparatus, or measures the area and position of a cream solder at an optional point on the printed circuit board, a comparison means 7b for comparing each data of the area and position measured by the measuring device 7a with the corresponding absolute decision criterion (A) and the operating state criterion (L), a memory means 7c for storing the comparing result, and an output means 7d for outputting a predetermined data stored in the memory means 7c to a decision means 10 for deciding the operating state in the precedent process. A concrete example of the measuring device 7a is shown in FIG. 14.

Referring to FIG. 2, in the case, for example, where the apparatus 6 is a cream solder printing apparatus and an object to be inspected is the area of the cream solder, the absolute decision criterion (A) is set in the range of from S1 to S4, and the operating state criterion (L) is set in the range of from S2 to S3 (S1<S2<S3<S4 . . . area of the cream solder). The to-be-inspected object may possibly be the positional shift of the cream solder.

The inspecting apparatus 7 determines the object to be good (non-defective) if the object is within the allowable range (indicated by (g1), (g2) in FIG. 2) and defective if the object is outside the allowable range (denoted by (b)) based on the absolute decision criterion (A). The good work is sent to the apparatus 8 for the succeeding process, while the defective one is transferred to a printed circuit board stockroom or the like.

The inspecting apparatus 7 is additionally provided with the decision means 10 for deciding the operating state of the apparatus 6 in the precedent process on the basis of the inspecting data outside the operating state criterion (L) and inside the allowable range of the absolute decision criterion (A) (corresponding to those represented by (g2) in FIG. 2). Accordingly, only the inspecting data represented by (g2) is stored and retained (shown by (p) in FIG. 1A), based on which the operating state of the apparatus 6 is detected. For instance, if the inspecting data represented by (g2) is generated at a higher frequency than a predetermined value, a danger predicting data (indicated by (q) in FIG. 1A) is fed to the apparatus 6 to provide an indicating that the operating state of the apparatus 6 must be inspected and corrected, thereby avoiding production of inferior works. Moreover, the inspecting data indicated by (g2) is made use of detecting how the operating state of the apparatus 6 is (e.g., whether the cream solder is blurred or dimmed) or how the accuracy is, to thereby perform an appropriate treatment.

Since the decision means 10 handles only the inspecting data indicated by (g2), the decision means 10 is able to make a decision in a short time. Even if the apparatus 6 should be stopped in an emergency in accordance with the danger predicting data (q), it will be carried out with respect to a mass production system.

Although the decision means 10 handles only the inspecting data indicated by (g2) in the above first embodiment, it can be so designed that the inspecting data represented by (b) is also treated by the decision means 10. In addition, although the operating state criterion (L) is a single criterion set in the above embodiment, a plurality of operating state criteria (L) may be prepared for the inspecting apparatus 7.

The inspecting apparatus in the first embodiment of the present invention as above is capable of distinguishing not only proper and improper works, but the operating state of the apparatus in the precedent process reliably and quickly.

A second embodiment of the present invention will be depicted below with reference to FIGS. 3A–6.

Figure 3A:
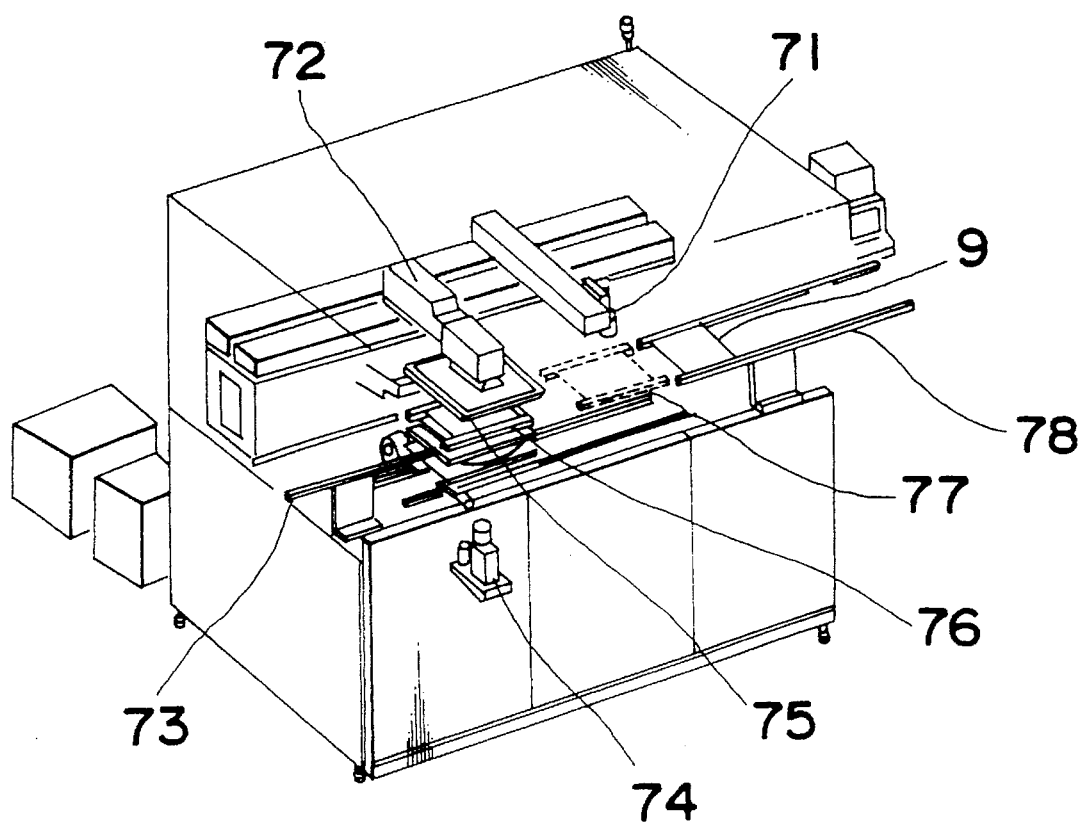
FIG. 3A is a diagram showing the whole of a cream solder printing apparatus with an inspecting apparatus according to a second embodiment of the present invention.

FIG. 3A illustrates the whole of a cream solder printing apparatus 11. In FIG. 3A, reference numerals respectively represent: 71 a recognizing device such as a camera or the like for recognizing the printing mark on a printed circuit board 9; 72 a main body of the printing apparatus 11; 73, 78 guide rails for guiding the printed circuit board 9; 74 a driving device of a table supporting the printed circuit board 9 at the printing time; 75 a metal mask; and 76 a transfer device for transferring the printed circuit board 9 to a predetermined position. The printed circuit board 9 is set at a position 77 of the transfer device 76. In the cream solder printing apparatus, when the mark on the printed circuit board 9 is recognized by the recognizing device 71, the printed circuit board 9 is transferred to the printing position from the guide rail 78 by the transfer device 76 and set on the table. Subsequently, the printed circuit board is printed in a predetermined manner by the cream solder via the metal mask 75 by the main body 72. The printed circuit board 9 after printing is discharged from the printing apparatus by the other guide rail 73.

Figure 15:
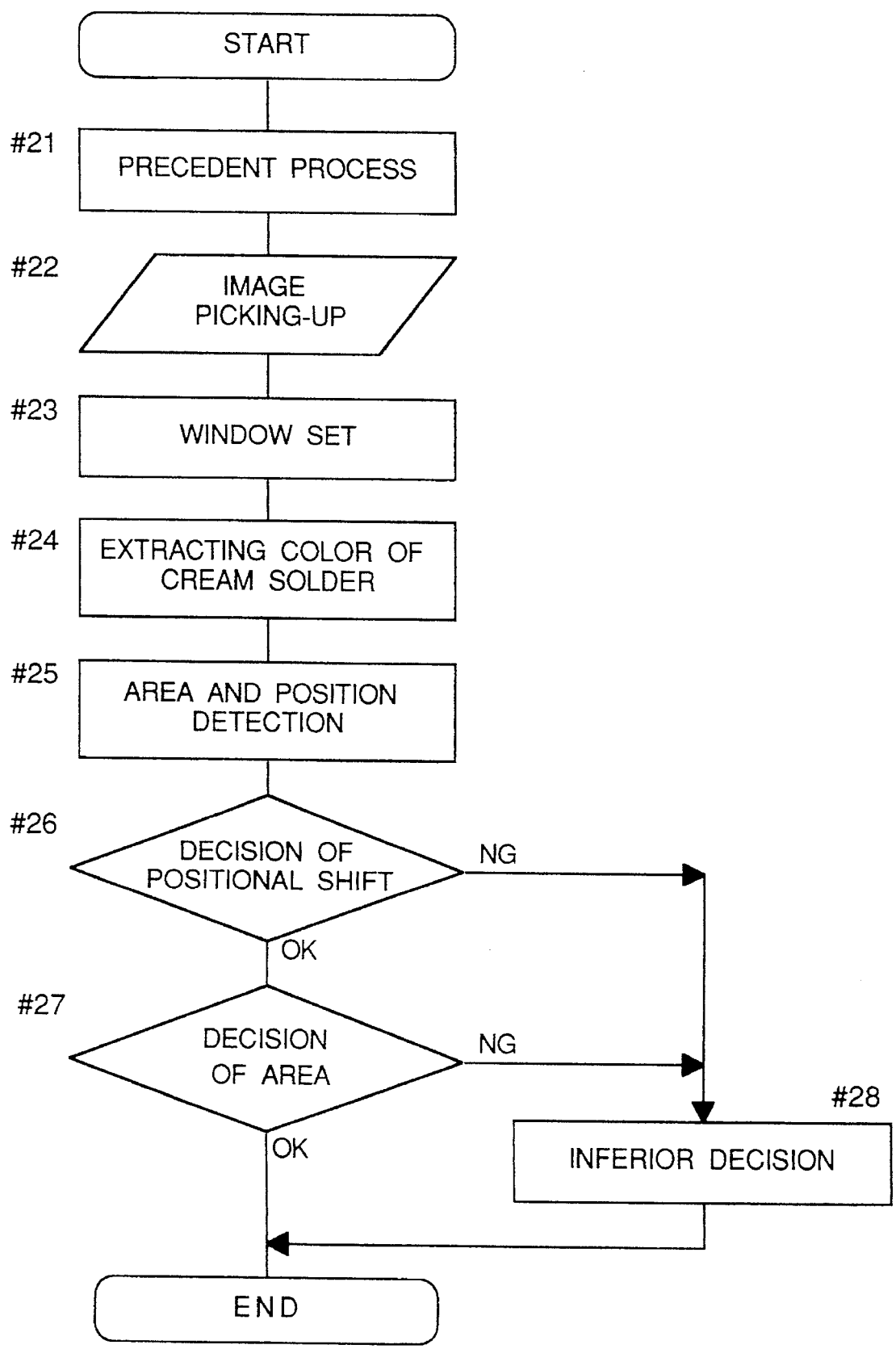
FIG. 15 is a flow chart of the inspecting method according to the fourth embodiment of the present invention.

An inspecting apparatus 13 which inspects the printing state of the cream solder on the printed circuit board 9 by measuring the area of the cream solder printed by the cream solder printing apparatus 11 in the precedent process is the same as the inspecting apparatus 7 discussed afterward with reference to FIG. 15. As in FIG. 2, the inspecting apparatus 13 is provided with an absolute decision criterion (A) formed on the basis of each design value of the metal mask so as to detect the printing state of the cream solder, and an operating state criterion (L) formed on the basis of each design value of the metal mask so as to detect the operating state of the cream solder printing apparatus 11.

Figure 3B:
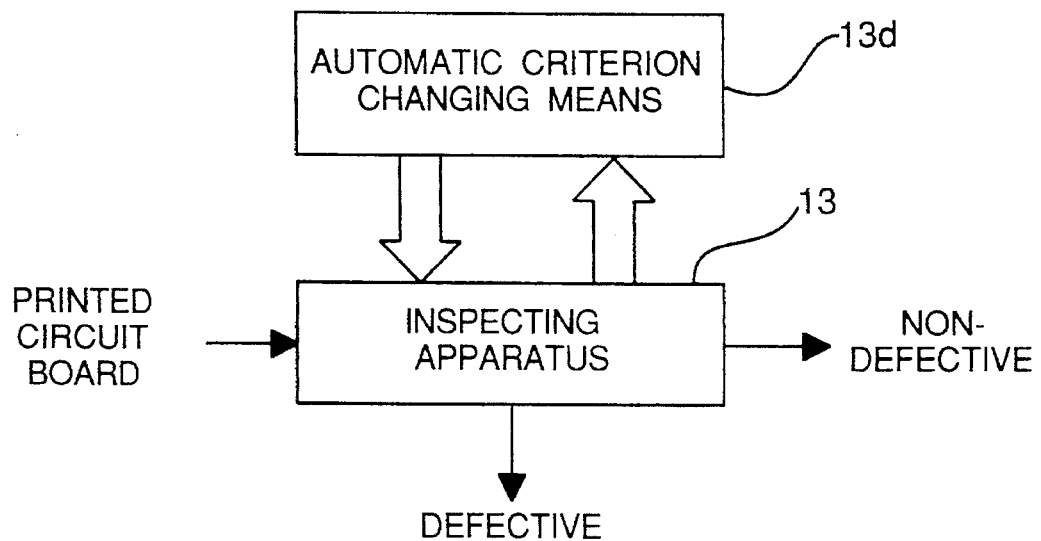
FIG. 3B is a schematic block diagram of a mounting line including the inspecting apparatus according to the second embodiment of the present invention.
Figure 3C:
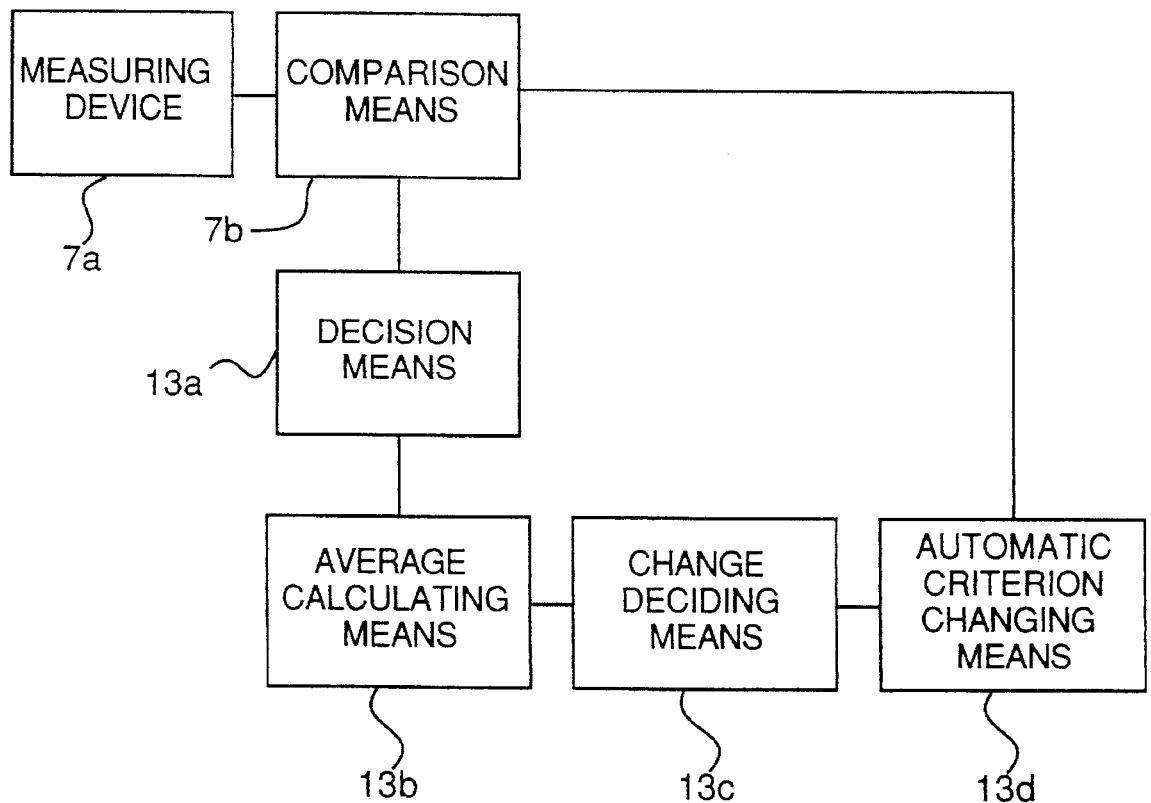
FIG. 3C is a block diagram of the inspecting apparatus of FIG. 3B.

Concretely, as shown in FIGS. 3B and 3C, a criterion changing means is added to the inspecting apparatus 13, more specifically, to the comparing means 7b of the inspecting apparatus 7 in the first embodiment. In other words, the inspecting apparatus 13 is provided with a measuring device 7a, a comparison means 7b, a decision means 13a, an average calculating means 13b, a change deciding means 13c, and an automatic criterion changing means 13d. The measuring device 7a measures the area and position of the cream solder at an optional point (n) on the printed circuit board 9. The comparison means 7b forms and stores each absolute decision criterion (A) by adding the allowable value (indicated by percentage or an absolute value) fit for the efficiency of the line to each design value of the position and area of the metal mask, forms and stores each operating state criterion (L) within each absolute decision criterion (A), and compares the data of the area and position measured by the measuring device 7a with the respective absolute decision criteria (A) and the operating state criteria (L). The decision means 13a decides whether only the data of the area and position at a specific section of the cream solder is within the absolute decision criteria (A) and outside the operating state criteria (L). The average calculating means 13b calculates the respective average value of the data of the specific section when the data of the specific section is decided to be outside the operating state criteria (L) by the decision means 13a. The change deciding means 13c decides whether or not the respectively calculated average value is shifted within the range of preset values.

The automatic criterion changing means 13d changes the operating state criterion (L) to an operating state criterion (L') in a manner not to determine a defective work as good if the change deciding means 13c decides that the average value is shifted within the range of preset values, and inputs the new operating state criterion (L') to the comparison means 7b to replace the operating state criterion (L) with the operating state criterion (L').

Figure 3D:
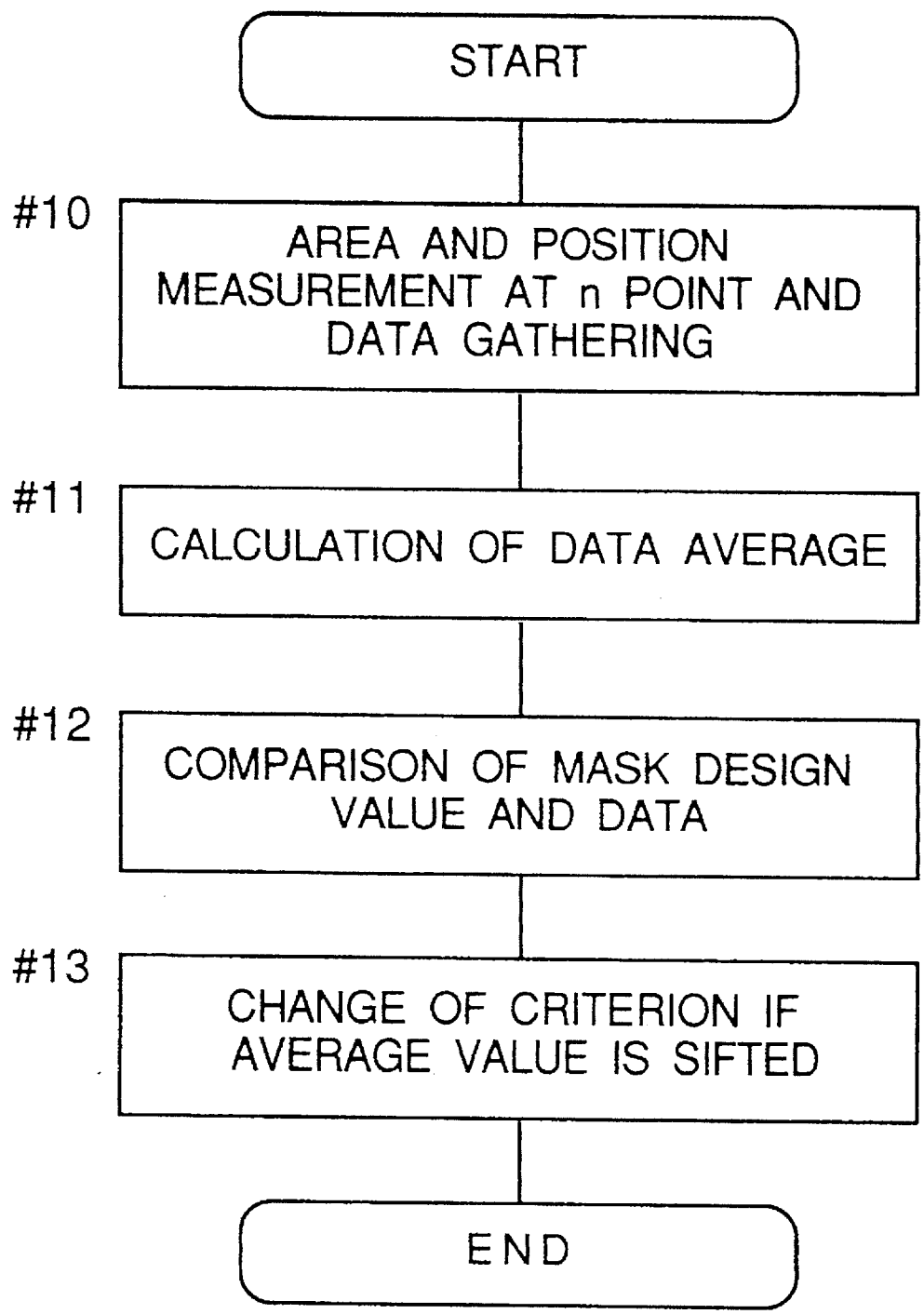
FIG. 3D is a flow chart of the operation of the inspecting apparatus of FIG. 3C.
Figure 5:
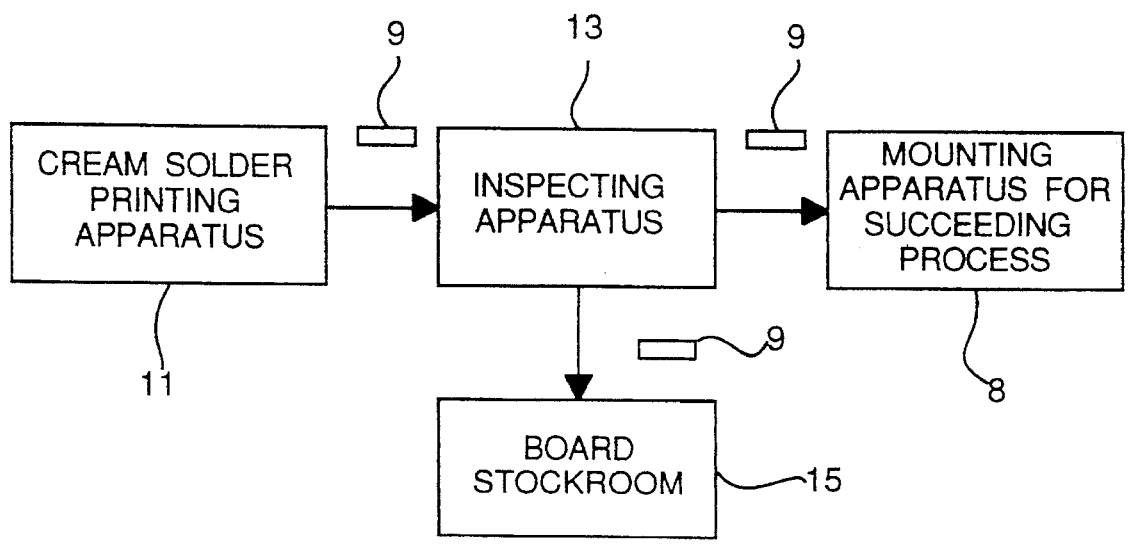
FIG. 5 is a schematic block diagram of a mounting line including an inspecting apparatus.

The fundamental operation of the measuring device 7a and the comparison means 7b in the inspecting apparatus 13 is the same as in the first embodiment. Therefore, only a differences will be described hereinbelow. FIG. 3D is a flow chart of the operation when the data of the specific section is decided to be outside the operating state criterion (L) by the decision means 13a. The area and position of the cream solder at an optional point (n) on the printed circuit board 9 are measured by the measuring device 7a in step #10, and then, the average value of each of the area and position measured by the measuring device 7a is calculated by the average calculating means 13b in step #11. In comparison between each calculated average value and each design value of the metal mask, the change deciding means 13c decides in step #12 whether or not each calculated average value is shifted within each range of preset values. In the case where the average value is not shifted, the operating state criterion (L) is not changed. If the average value is shifted, the operating state criterion (L) is changed to (L') by the automatic criterion changing means 13d in step #13 in a manner not to decide an inferior work to be good. The operating state criterion (L') is input to the comparison means 7b, so that the operating state criterion afterwards becomes (L').

Using each design value ($S_0$) of the metal mask as the center, an upper limit of the absolute decision criterion (A) is set to be (S4), while a lower limit thereof is (S1). The works within the range of from (S4) to (S1) are decided to be good (indicated by (g1), (g2) in FIG. 2), and those outside the range are decided to be defective (indicated by (b) in FIG. 2). The inspecting apparatus 13 sends the good ones to the succeeding process and the defective ones to a printed circuit board stockroom 15. The absolute decision criterion (A) is absolute and never changed at all in the middle of the process.

An upper limit and a lower limit of the operating state criterion (L) are initially set to be (S3) and (S2), respectively, while each design value ($S_0$) of the metal mask is at the center value located between the upper and lower limits. Within the range (S3–S2), the operating state in the precedent process is determined to be normal. Outside the range, however, the operating state is decided to be abnormal. The range (S3–S2) is set within the range (S4–S1) of the absolute decision criterion (A).

If the area of the cream solder is frequently detected to be not smaller than (S3), it is found by using the operating state criterion (L) that the cream solder is inclined to ooze, and therefore, the printing condition of the printing apparatus 11 is corrected so that the cream solder is turned to be printed faintly.

In the case where only the area of the cream solder corresponding to a specific opening portion of a printed circuit board is decided to be outside the operating state criterion (L) by the decision means 13a, a process error is presumed to be present between the area of the opening portion and each design value and then it is presumed to be an error that the center value of the operating state criterion (L) is set to be ($S_0$). In such case as above, as shown in FIGS.

3B and 3C according to the second embodiment, many measuring results of the area of the cream solder corresponding to the specific opening portion are collected and stored, and then an average value thereof ($S_0'$) is calculated by the average calculating means 13b so as to change the center value ($S_0$). Then, each of the calculated average values ($S_0'$) of the area and position is compared with each of the design values of the metal mask by the change deciding means 13c, thereby to decide whether or not each of the calculated average values is shifted within the range of preset values. The operating state criterion (L) is not changed if the calculated average value has no shift. If the average value is shifted, the operating state criterion (L) is changed by the automatic criterion changing means 13d to the operating state criterion (L') which has the average value ($S_0'$) as the center value so that an inferior product is not decided to be good. The operating state criterion (L') is input to the comparison means 7b and used afterwards.

Figure 4:
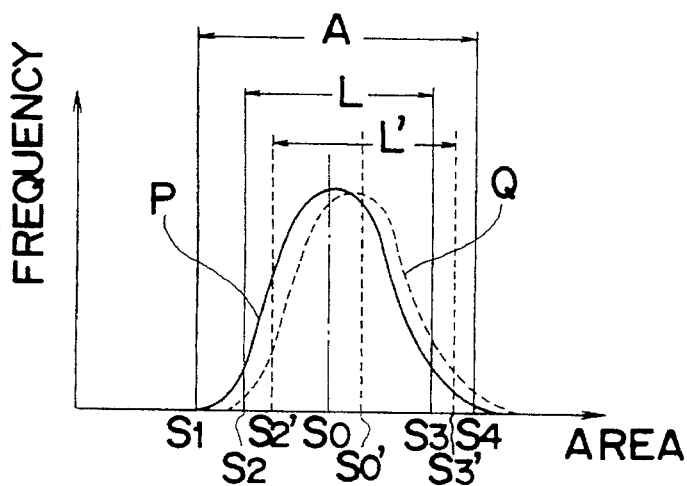
FIG. 4 is a graph of the distribution model of the area of cream solder.
Figure 6:
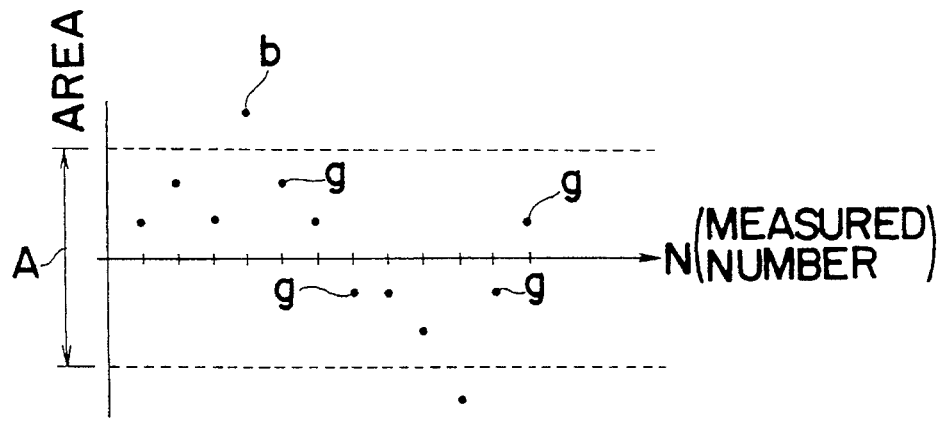
FIG. 6 is a graph showing an absolute decision criterion.

In FIG. 4, (P) indicates the distribution model of the area of the cream solder in the case where the opening portion is designed in compliance with each design value of the metal mask and, (Q) is the distribution model of the area of the cream solder when a process error is present in the opening portion of the metal mask. The automatic criterion changing means 13d makes it possible to decide the printing state of the cream solder based on the actually measured area of the opening portion of the metal mask while using the operating state criterion (L') having the center value ($S_0'$), the upper limit (S3'), and the lower limit (S2').

In the second embodiment, the automatic criterion changing means 13d is so adapted as to change the criterion (L) to (L') only when the opening portion is outside the operating state criterion (L). However, the operating state criterion (L) may be made changeable to any opening portion whether the opening portion is inside or outside the criterion (L).

According to the second embodiment, the inspecting apparatus can decide not only whether the printing state of the cream solder is good or bad, but the operating state of the printing apparatus accurately without being influenced by the process error of the metal mask. The working condition is thus made proper.

A third embodiment of the present invention will now be described with reference to FIGS. 7–13.

Figure 7:
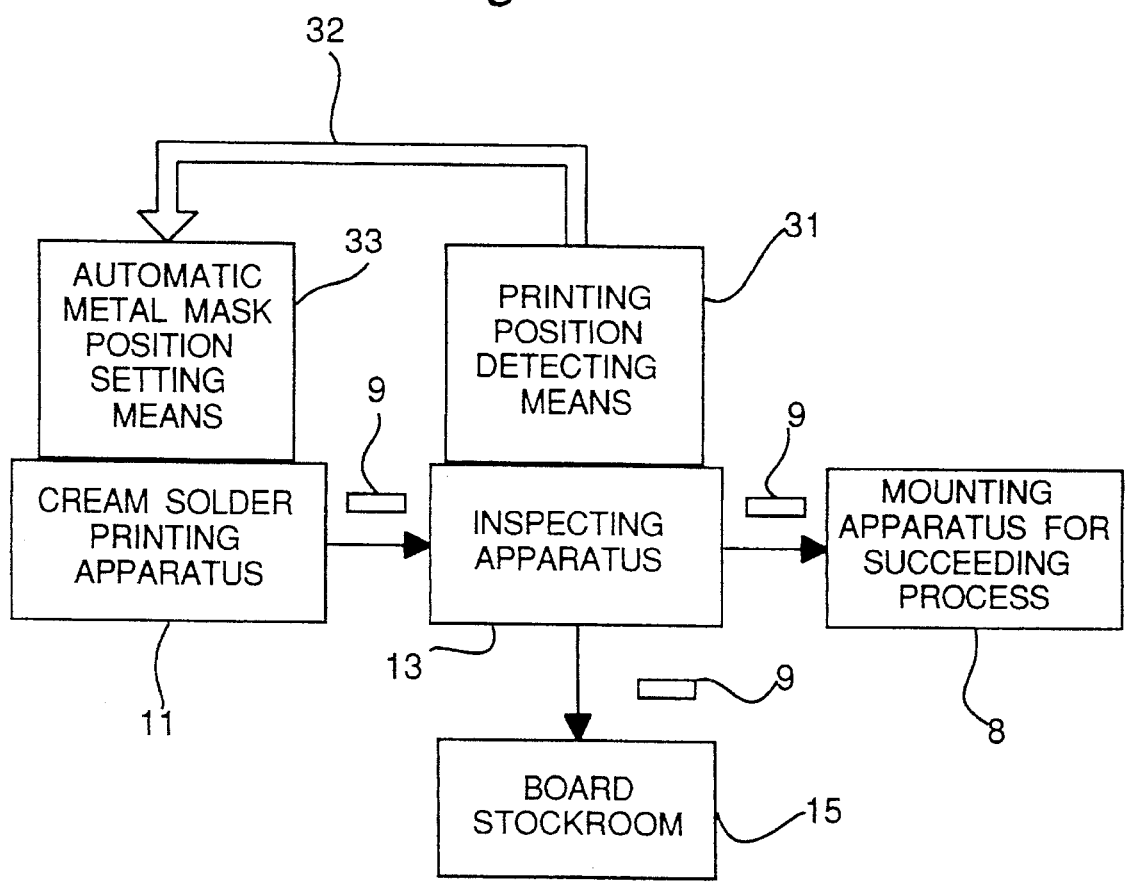
FIG. 7 is a schematic block diagram of a mounting line including an inspecting apparatus according to a third embodiment of the present invention.
Figure 8:
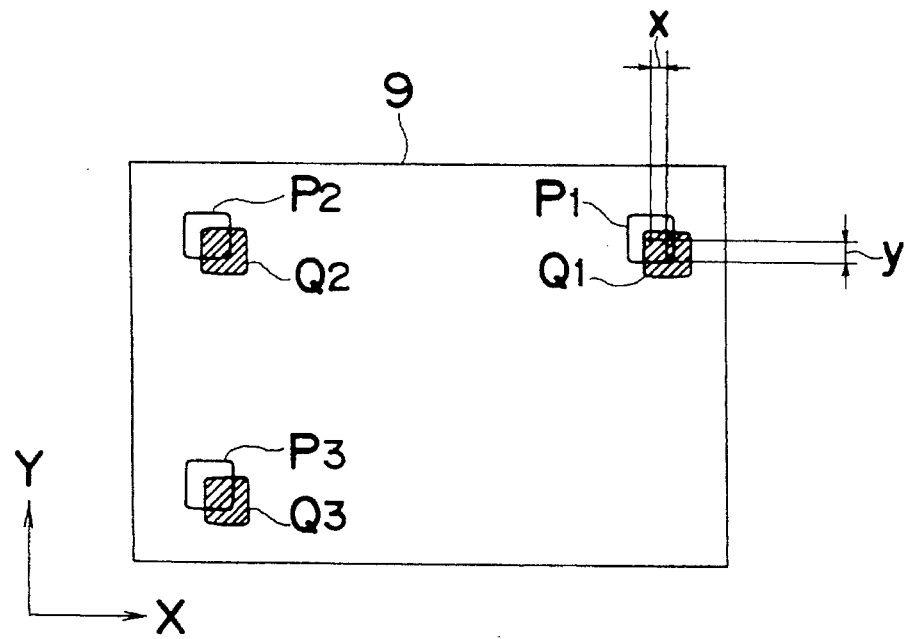
FIG. 8 is a diagram showing the inspecting criterion of the inspecting apparatus of FIG. 7.
Figure 9:
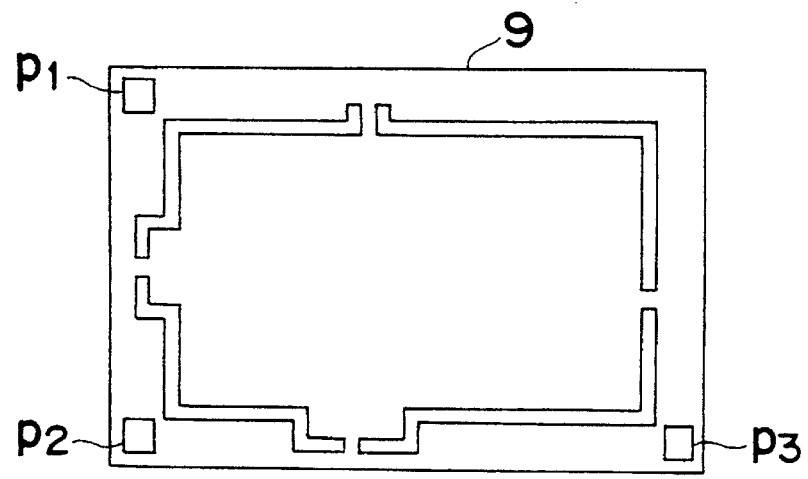
FIG. 9 is a plan view of a printed circuit board in a modified example of the third embodiment.

In FIG. 7, a cream solder printing apparatus 11 in the precedent process, an inspecting apparatus 13 for the inspection of printing of the cream solder, and an apparatus 8 for the succeeding process are aligned on the mounting line. The printing state of the cream solder of a printed circuit board 9 printed by the printing apparatus 11 is inspected by the inspecting apparatus 13. A good printed circuit board is forwarded to the succeeding apparatus 8, while a defective printed circuit board is sent to the printed circuit board stockroom 15.

As shown in FIG. 2, the inspecting apparatus 13 has an absolute decision criterion (A) of a predetermined allowable range so as to decide the printing state of the cream solder. Based on the criterion (A), the inspecting apparatus 13 decides those within the allowable range to be good (indicated by (g)) and those outside the range to be inferior (indicated by (b)), and sends good ones to the succeeding process and inferior ones to the printed circuit board stockroom 15.

The inspecting apparatus 13 is provided with a printing position detecting means 31 for detecting the printing position of the cream solder at least at three points on the printed circuit board 9 thereby to obtain the shifting amount of printing. The printing position detecting means 31 detects centers of cream solders Q1, Q2, and Q3 printed on the electrode surfaces P1, P2, and P3 shown in FIG. 8. The centers of the electrode surfaces P1, P2, and P3 are known beforehand from the design values of the printed circuit board. The shifting amount (x) in the X direction and the shifting amount (y) in the Y direction between the center of the cream solder and the center of the corresponding electrode surface are obtained at each of the above three points. The printing position detecting means 31 calculates the average value of each of the shifting amounts (x) and (y) of three points. The average values are sent as the data of the shifting amounts of printing to an automatic metal mask position setting means 33 of the printing apparatus 11 via a transmission means 32 such as a wire.

The automatic position setting means 33 is well known and set in the cream solder printing apparatus 11 to automatically determine the initial setting position of the metal mask. The automatic setting means 33 is utilized to automatically correct the position of the metal mask in the third embodiment.

Although the shifting amount of printing is detected at three points on the printed circuit board in the above embodiment, it may be detected at four or more points of the printed circuit board. Moreover, as is readily understood from FIG. 9, the electrode surfaces P1, P2, and P3 may be formed at three or more points at the corner of the printed circuit board 9 and the shifting amount may be detected with the use of the cream solder printed on these electrode surfaces.

A modified example of the third embodiment will now be depicted hereinbelow, whereby the shifting amount of printing is detected at two points and the shifting amount of the rotating angle of a straight line connecting the two points is detected.

Figure 10:
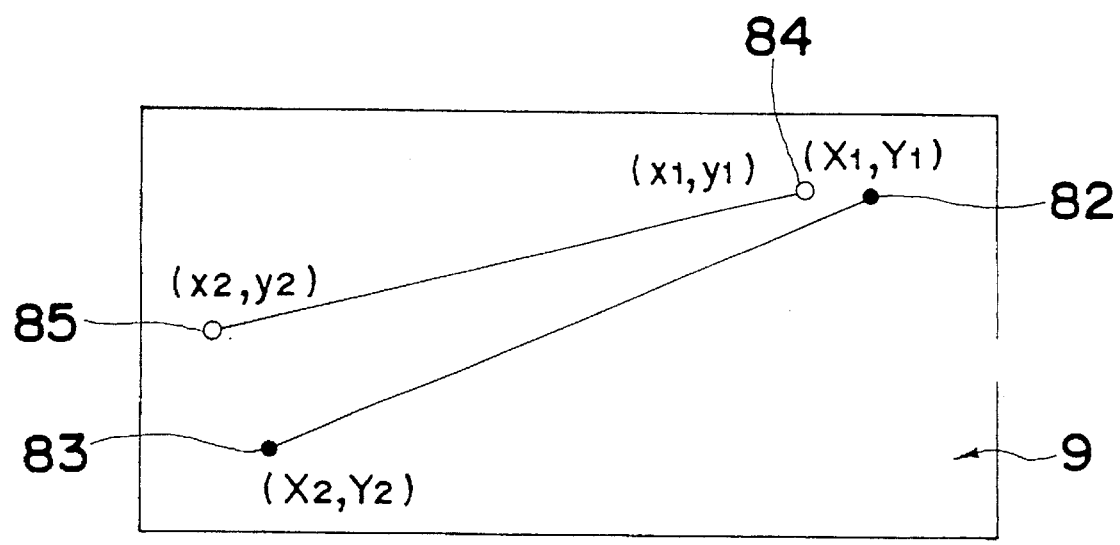
FIG. 10 is a diagram showing the inspecting criterion of an inspecting apparatus according to a further modification of the third embodiment.

In FIG. 10, reference numerals respectively indicate: 9 a printed circuit board to be inspected; 82 coordinates (X1, Y1) of the design value of a first shift correcting land; 83 coordinates (X2,Y2) of the design value of a second shift correcting land; 84 coordinates (x1,y1) of the center of the cream solder printed on the first shift correcting land; and 85 coordinates (x2,y2) of the center of the cream solder printed on the second shift correcting land.

The shifting amounts (x,y,θ) in the X, Y, θ (rotation) directions are expressed by equations as follows:

$$x=|(X1+X2)/2-(x1+x2)/2|$$

$$Y=|(Y1+Y2)/2-(y1+y2)/2|$$

$$\theta=\tan^{-1}\{(Y2-Y1)/(X2-X1)\}-\tan^{-1}\{(y2-y1)/(x2-x1)\}$$

It is to be noted here that either of $\tan^{-1}(*)=90°$ or $\tan^{-1}(*)=\tan^{-1}(*)+180°$ is held when the denominator is equal to zero.

Now, a mechanism to correct the detected shifting amount will be discussed below.

Figure 11:
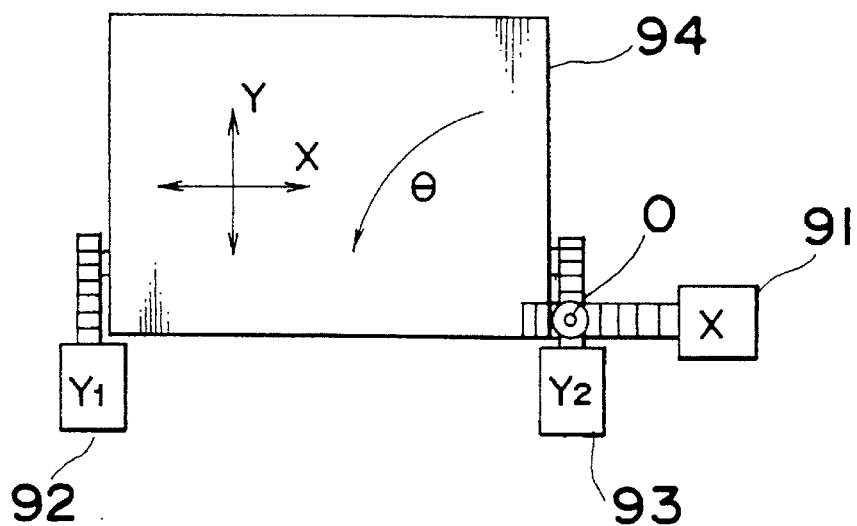
FIG. 11 is a schematic diagram of a driving mechanism of a metal mask in the modification of FIG. 10.

Referring to FIG. 11, an X-axis driving device 91 is driven so as to move a metal mask 94 in the X-axis direction. If the metal mask 94 is to be driven in the Y-axis direction, two Y-axis driving devices 92, 93 are synchronously driven. In order to rotate the metal mask 94 in the θ direction, the X-axis driving device 91 and one Y-axis driving device 93 are activated while the other Y-axis driving device 92 is held stationary, so that the printed circuit board 9 is rotated around (O). A rotary shaft of the motor of each driving device is provided with a ball screw. Since a part of the metal mask 94 is fitted in the ball screw part of the rotary shaft, the metal mask 94 coupled to the rotary shaft of the motor is moved to and fro along a predetermined direction in accordance with the rotation of the motors in the forward and backward directions.

Figure 12:
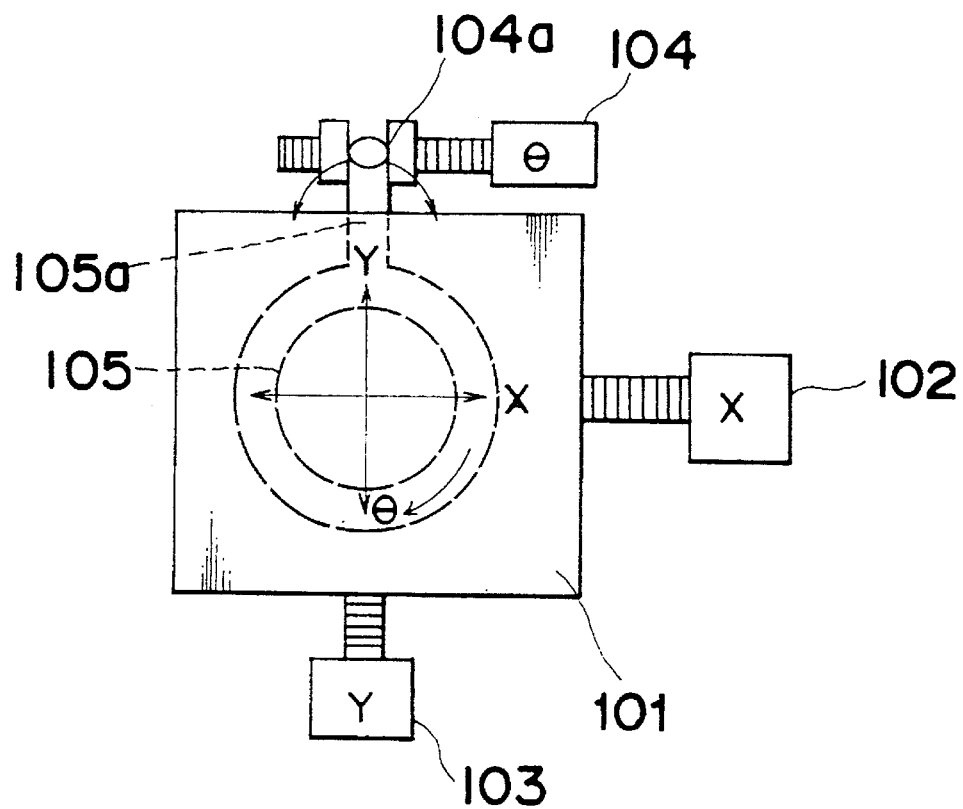
FIG. 12 is a schematic diagram of a driving mechanism of a printed circuit board in the modification of FIG. 10.
Figure 13:
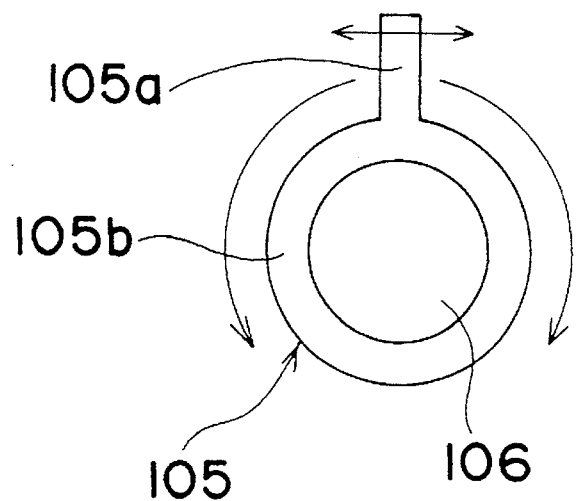
FIG. 13 is a partial view of the driving mechanism of the printed circuit board in FIG. 12.

A table 101 supporting the printed circuit board 9 may be moved, instead of moving the metal mask 94. As shown in FIG. 12, an X-axis driving device 102 is actuated to move the table 101 in the X-axis direction. A Y-axis driving device 103 is actuated to move the table 101 in the Y-axis direction. Meanwhile, when the table 101 should be moved in the θ direction, as shown in FIG. 13, a projection 105a projecting in the radial direction from an annular part 105b secured to the bottom surface of the table 101 is fitted into a groove 104a of the rotary shaft of a θ-direction driving device 104, and the projection 105a together with the groove 104a is linearly moved following the rotation of the rotary shaft. As a result, the annular part 105b guided by a cylindrical guide member 106 is rotated forward and backward to move in the θ direction.

According to the inspecting apparatus of the third embodiment of the present invention described above, not only the printing state of the cream solder on the printed circuit board can be detected, but the positional shift of the metal mask is detected thereby to automatically correct the position of the metal mask properly. Therefore, the cream solder can be printed with stable positioning accuracy. At the same time, the positional shift of the metal mask can be corrected efficiently.

A fourth embodiment of the present invention, namely, an inspecting method of printing of cream solder will be described hereinbelow with reference to FIGS. 14–18.

Figure 17:
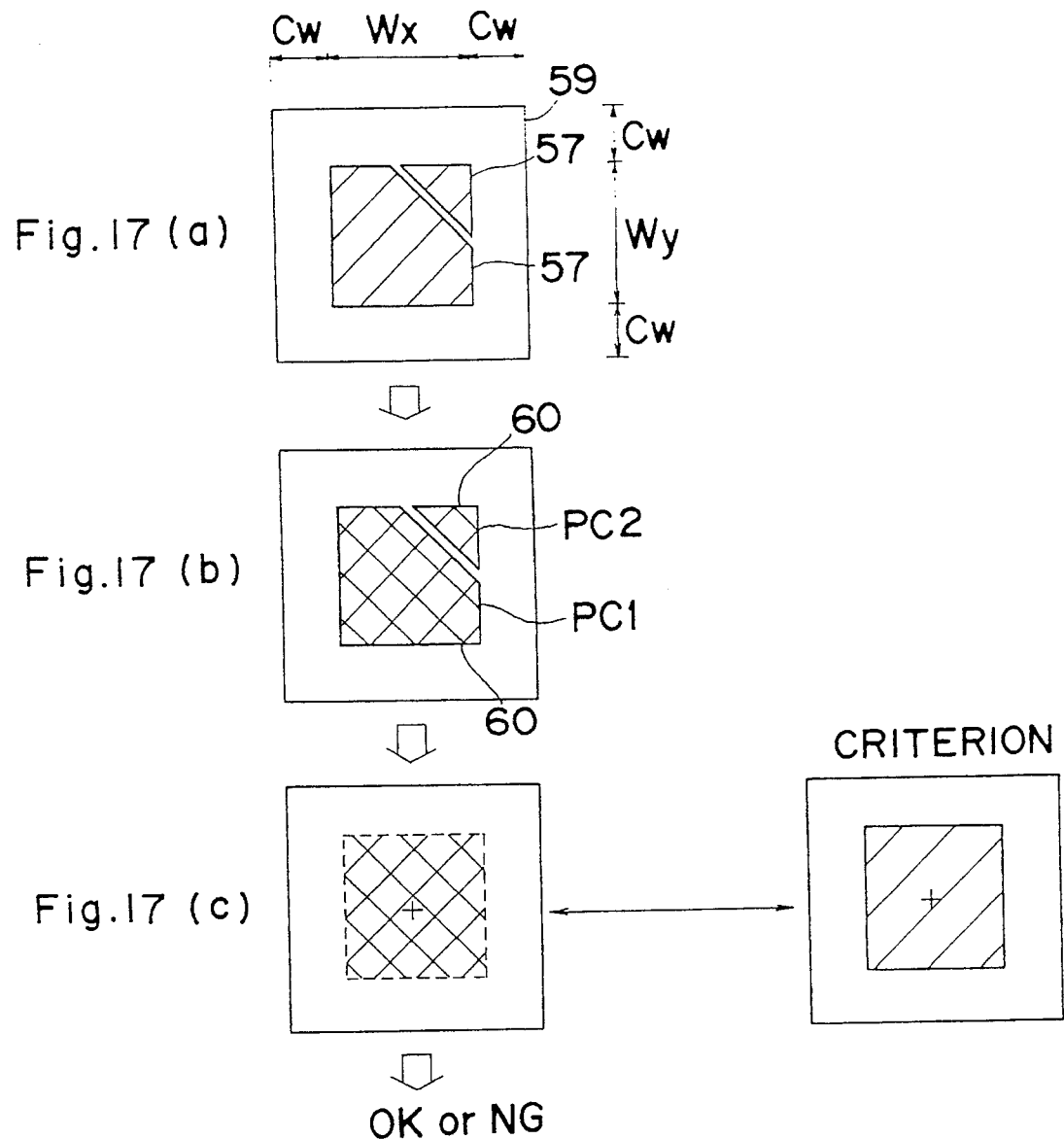
FIGS. 17(a), 17(b), and 17(c) are respectively schematic diagrams of a printed pattern of cream solder corresponding to the inspecting method of FIG. 15.

A flow chart of FIG. 15 of the fourth embodiment will be explained with reference to FIGS. 14 and 17. In FIGS. 14, 15, and 17, as the pretreatment, a reference value (Sk) of the area of the individual cream solder and a position reference value (Xk,Yk) are input to an image recognizing device 54 and set in a memory. The reference value (Sk) is calculated from each design value of a metal mask to show an area value of individual patterns. The position reference value (Xk,Yk) is calculated from each design value of a metal mask to show a center position of gravity of individual patterns. Moreover, an area (SL) to be decided as a noise pattern, an allowable value (DX,DY) of the positional shift when the cream solder is decided to be inferior, an allowable value (DS) of the area, an outer dimension (Wx,Wy) of the individual cream solder, and an allowable value of the window (Cw) are also input to the device 54 to be set in the memory (step #21). The area (SL) to be decided as a noise pattern is an area value equal to or more than a predetermined value set previously, that is, an area of the minimum individual pattern of individual patterns of dirt or contaminant of a printed circuit board, or dirt of a cream solder printed by a cream solder printing method. In the allowable value (DX,DY) of the positional shift, it is supposed that the maximum value of a positional shift in the X direction is DX, and the maximum value of a positional shift in the Y direction is DY. The allowable value (DS) of the area is an allowable value of an operating state criterion within an absolute decision criterion which is found by adding an allowable value (percentage or absolute value) corresponding to a mounting line ability to each allowable design value of an area of an individual pattern of the metal mask. The allowable value of the window (Cw) is the maximum value of positional shifts of the metal mask.

As in FIG. 14, an image pick-up unit 53 picks up an image of the printed circuit board 9 on which a cream solder 52 is printed (step #22). A window 59 is set for a cream solder 57 of the picked-up color image, as is clear in FIG. 17(a). The window 59 is of the size obtained by adding the allowable value (Cw) of the window to the outer dimension (Wx,Wy) of each of the individual cream solders 57. The center of the window 59 corresponds to the positional reference value (Xk,Yk) of the cream solder 57 (step #23). The color extraction of the cream solder 57 is carried out through the color recognition inside the window 59, as shown in FIG. 17(b), and all the patterns of the cream solder (PC1, PC2, . . . , PCn) of the area not smaller than the preset value (SL) are detected (step #24). Then, the position of the cream solder is detected according to an expression (1) below from the sum of the position of the center of gravity of each pattern corresponding to the area ratio of the detected patterns of the cream solder (step #25).

$$\left. \begin{array}{l} X = \sum_{i=1}^{n} (Si * Xi/S) \\ Y = \sum_{i=1}^{n} (Si * Yi/S) \\ S = \sum_{i=1}^{n} Si \end{array} \right\} \quad (1)$$

The positional shift is decided according to a decision expression below based on the calculated position (X,Y), a preliminarily stored reference position (Xk,Yk), and an allowable value of the positional shift (DX,DY) (step #26).

Decision expression Xk>X+DX or Xk<X−DX

Otherwise, decision expression Yk>Y+DY or Yk<Y−DY

If any of the above expressions is satisfied, printing is decided to be NG (no good). If none of the above expressions is held, printing is decided to be OK (step #26). Further, the area is decided according to the following expression on the basis of the detected area (S), the preliminarily set reference value (Sk), and the allowable value (DS) (step #27).

Sk>S+DS or Sk<S−DS

If either expression is held, printing is decided to be NG. On the other hand, when neither is held, printing is detected to be OK (step #27). In the case where NG is output in step #26 or #27, the cream solder is decided to be inferior (#28).

Referring back to FIG. 14, 55 indicates a keyboard and 56 is a cathode ray tube (CRT) as a display device.

Figure 16:
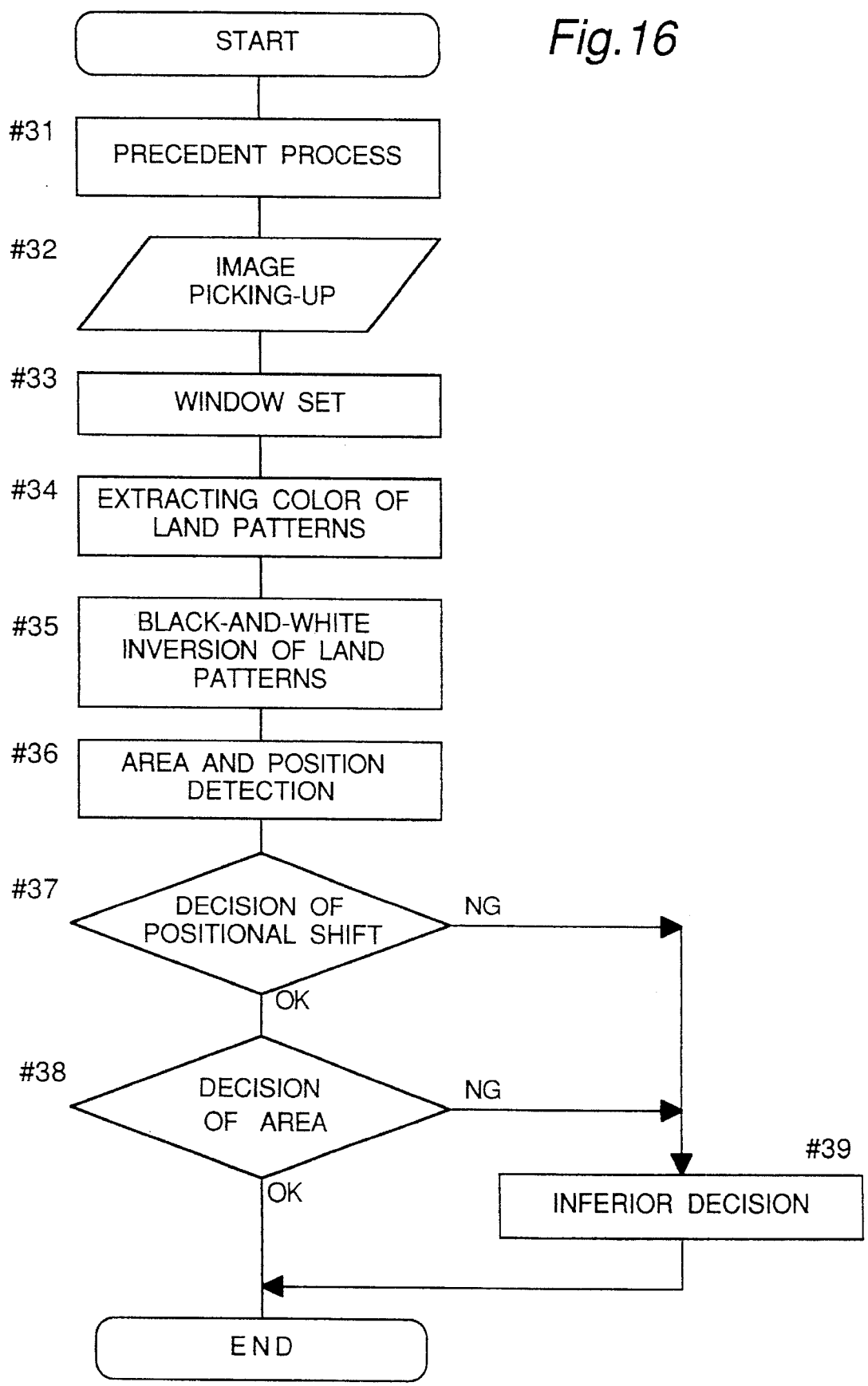
FIG. 16 is a flow chart of an inspecting method according to a modified example of the fourth embodiment.
Figure 18:
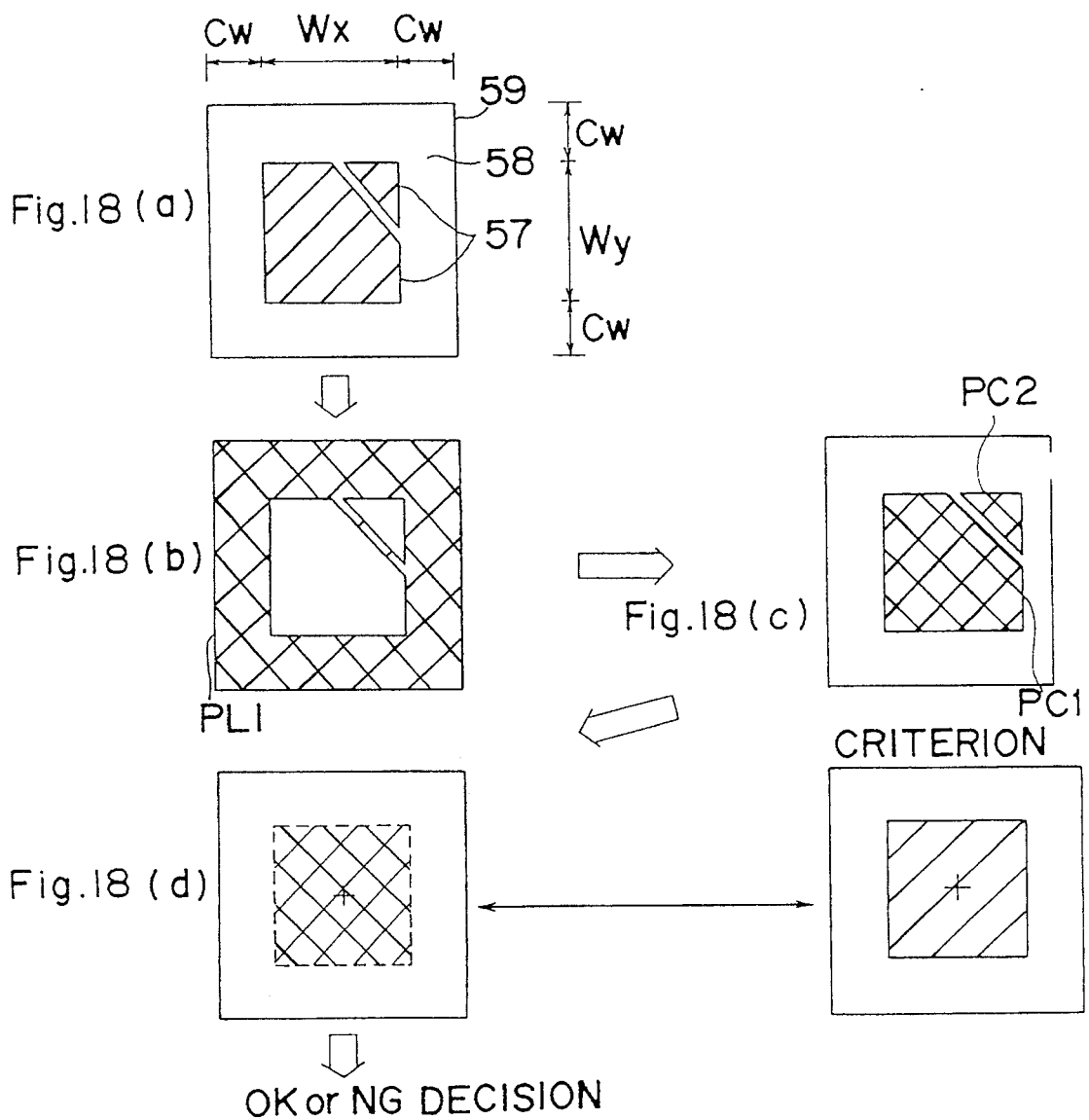
FIGS. 18(a), 18(b), 18(c), and 18(d) are respectively schematic diagrams of a printed pattern of cream solder corresponding to the inspecting method of FIG. 6.
Figure 19:
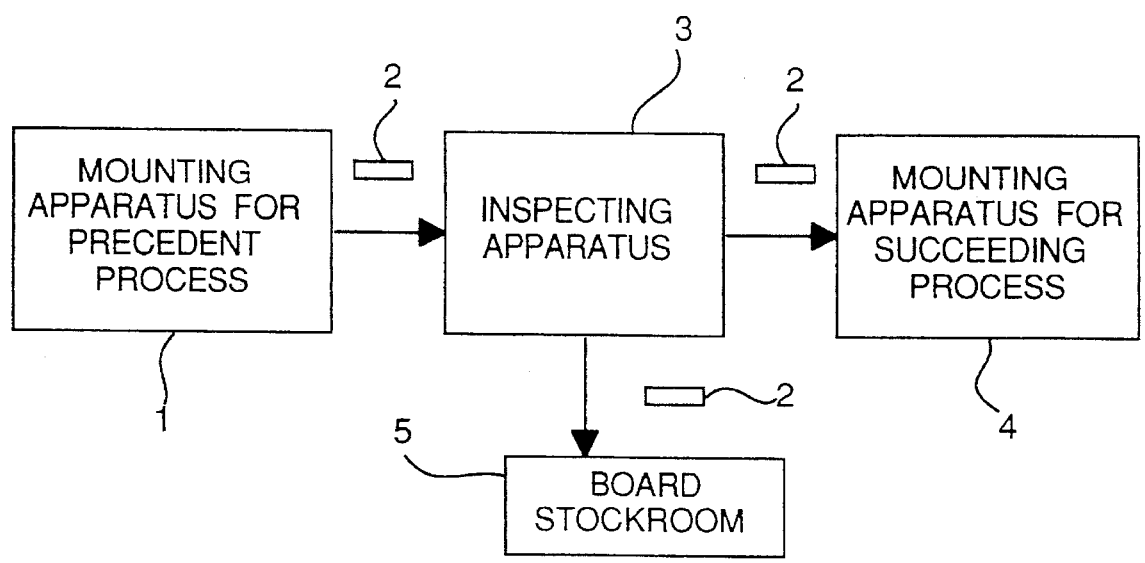
FIG. 19 is a schematic block diagram of a mounting line including a conventional inspecting apparatus.

A modified example of the fourth embodiment will be described with reference to a flow chart in FIG. 16 and, FIGS. 14 and 18. In FIGS. 14, 16, and 18, the reference value (Sk) of the area of the individual cream solder 57 and the positional reference value (Xk,Yk) are input to the image recognizing device 54 and set in the memory beforehand. At the same time, the area (SL) to be detected as a noise pattern, the allowable value (DX,DY) of the positional shift to decide that the cream solder is no good, the allowable value (DS) of the area, the outer dimension (Wx,Wy) of an individual electrode section (referred to as a land hereinafter) of the printed circuit board, and the allowable value of the window (Cw) are input to the recognizing device 54 and set in the memory (step #31).

As shown in FIG. 14, the image pick-up unit 53 picks up the image of the printed circuit board 9 having the cream solder 52 printed on a land 58 (step #32). In FIG. 18(a), the window 59 is set for the land 58 of the obtained color image. The window 59 is of the outer size of the individual land 58 and completely fits the configuration of the land 85 (step #33). In FIGS. 18(b) and 18(c), the color extraction of the land 58 is performed through the recognition of color in the window 59, thereby to detect all the binarized land patterns (PL1, PL2, . . . ) (Step #34). In FIG. 18(d), the detected land patterns are subjected to the black-and-white inversion, and accordingly, pseudo patterns (PC1, PC2, . . . , PCn) are detected (step #35). The pseudo patterns are individual patterns except for individual patterns of the electrodes of the printed circuit board which are detected from the windows which are circumscribed rectangles of the electrodes. The position of the cream solder is detected by the equation (1) described earlier from the sum of the position of the center of gravity of each pseudo pattern corresponding to the area ratio of the detected pseudo patterns (step #36).

The positional shift is hence decided in accordance with the following expression from the detected position (X,Y) and the reference position (Xk,Yk) and allowable value of positional shift (DX,DY) each preliminarily set in the memory:

Xk>X+DX or Xk<X−DK or Yk>Y+DY or Yk<Y−DY

If any one of the above expressions is held, printing is decided to be NG. On the contrary, printing is decided to be OK when none of the expressions is satisfactorily supported (step #37).

Moreover, the area is decided according to the following expression based on the detected area (S), and the reference value (Sk) and the allowable value (DS) each stored in the memory:

SK>S+DS or Sk<S−DS

When either one is satisfied, NG is decided. Otherwise, if both expressions are not held, printing is decided to be OK (step #38). The cream solder is decided to be improperly printed in the case where NG is generated in step #37 or #38 (step #39).

The inspecting method in the fourth and modified embodiments of the present invention is effective to correctly detect the position and area of the cream solder even if the cream solder is partly blurred and separated from one another due to the printing condition.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An inspecting method for a mounting line for inspecting an assembly state of an article obtained from a precedent process in the mounting line, which comprises the steps of:

using an image pick-up device to obtain an image of the article;

generating measurement data indicative of the assembly state of the article from the image obtained by the image pick-up device;

comparing the measurement data of the assembly state with an absolute decision criterion defining a predetermined allowable range of the measurement data and comparing the measurement data with an operating state criterion defining a second predetermined allowable range of the measurement data which is within the and narrower than the first predetermined allowable range; and deciding whether the assembly state of the article is defective based on whether the measurement data is within the first predetermined allowable image, and deciding an operating state of the proceeding process of the mounting line based on measurement data which is within the first predetermined allowable range and outside the second predetermined allowable range;

wherein the precedent process is cream soldering by a cream soldering apparatus, and wherein the assembly state is a cream solder state of a printed circuit board printed by the cream solder printing apparatus in the precedent process, wherein the absolute decision criterion and the operating state criteria are in accordance with a design value of a metal mask used in the cream soldering printing apparatus, wherein the deciding step comprises the steps of:

identifying measurement data which is both within the absolute decision criterion and outside the operating state criterion;

calculating an average value of the measurement data identified in the identifying step;

deciding whether the calculated average value is shifted within a predetermined range; and changing the operating state criterion in a manner not to decide defective as non-defective if the average value is decided in the change deciding step to be shifted within the predetermined range, and then replacing the operating state criterion with a new operating state criterion.

2. An inspecting apparatus arranged on an electronic component mounting line for inspecting an assembly state of an article obtained from a precedent process of the mounting line, the inspecting apparatus comprising:

an image pick-up device for obtaining an image of the article;

means for generating measurement data indicative of the assembly state of the article to be inspected from the image obtained by said image pick-up device;

a comparing means for comparing the measurement data of the assembly state with an absolute decision criterion defining a first predetermined allowable range of the measurement data and for comparing the measurement data of the assembly state with an operating state criterion defining a second predetermined allowable range of the measurement data which is within and narrower than the first predetermined allowable range; and a deciding means for deciding whether the assembly state of the article is defective based on whether the measurement data is within the first predetermined allowable range, and for deciding an operating state of the precedent process of the mounting line based on measurement data which is within the first predetermined allowable range and outside the second predetermined allowable range;

wherein the precedent process is cream soldering by a cream soldering apparatus, and wherein the assembly state is a cream solder state of a printed circuit board printed by the cream solder printing apparatus in the precedent process, wherein the absolute decision criterion and the operating state criteria are in accordance with a design value of a metal mask used in the cream soldering printing apparatus, and wherein the deciding means includes:

an identifying means for identifying data which is both within the absolute decision criterion and outside the operating state criterion;

an average value calculating means for calculating an average value of measurement data identified by the identifying means;

a change deciding means for deciding whether the calculated average value is shifted within a predetermined range; and an automatic criterion changing means for changing the operating state criterion in a manner not to decide defective as non-defective if the average value is decided by the change deciding means to be shifted within the predetermined range, and then inputting a new operating state criterion to the comparison means to replace the operating state criterion.

* * * * *